(12) United States Patent
Lee et al.

(10) Patent No.: US 11,336,311 B2
(45) Date of Patent: May 17, 2022

(54) ELECTRONIC DEVICE AND METHOD FOR CALIBRATING AND DETECTING PERFORMANCE OF RADIO-FREQUENCY INTEGRATED CIRCUIT

(71) Applicant: Samsung Electronics Co., Ltd., Gyeonggi-do (KR)

(72) Inventors: Hanyeop Lee, Gyeonggi-do (KR); Jooseung Kim, Gyeonggi-do (KR); Jiyong Kim, Gyeonggi-do (KR); Jongin Lee, Gyeonggi-do (KR); Hyosung Lee, Gyeonggi-do (KR); Ilpyo Hong, Gyeonggi-do (KR); Hyoseok Na, Gyeonggi-do (KR)

(73) Assignee: Samsung Electronics Co., Ltd

( * ) Notice: Subject to any disclaimer, the term of this patent is extended or adjusted under 35 U.S.C. 154(b) by 78 days.

(21) Appl. No.: 17/011,533

(22) Filed: Sep. 3, 2020

(65) Prior Publication Data
US 2021/0075449 A1 Mar. 11, 2021

(30) Foreign Application Priority Data
Sep. 5, 2019 (KR) .......................... 10-2019-0109880

(51) Int. Cl.
*H04B 1/04* (2006.01)
*H03F 3/213* (2006.01)
(Continued)

(52) U.S. Cl.
CPC ......... *H04B 1/0078* (2013.01); *H01Q 1/2208* (2013.01); *H01Q 3/247* (2013.01);
(Continued)

(58) Field of Classification Search
CPC ...... H04B 1/04; H04B 1/0458; H04B 1/0483; H04B 1/0078; H04B 2001/0408;
(Continued)

(56) References Cited

U.S. PATENT DOCUMENTS

| 8,140,031 B2 * | 3/2012 | Tsfati | ...................... H04B 17/13 455/114.3 |
| 8,422,968 B2 * | 4/2013 | Donovan | .................. H04B 1/04 455/127.2 |

(Continued)

FOREIGN PATENT DOCUMENTS

WO  WO 2017/019257  2/2017

OTHER PUBLICATIONS

International Search Report dated Dec. 3, 2020 issued in counterpart application No. PCT/KR2020/011903, 10 pages.

*Primary Examiner* — Quochien B Vuong
(74) *Attorney, Agent, or Firm* — The Farrell Law Firm, P.C.

(57) ABSTRACT

Disclosed is an electronic device including an antenna module comprising a plurality of radio frequency (RF) chains, and a processor configured to control the antenna module, wherein each of the RF chains comprises an amplifier that amplifies power and a power detector, and wherein the antenna module further comprises a switching circuit that selectively switches between a first path and a second path, the first path being a connection through which an RF signal converted in the antenna module is transmitted to the power detector causing the RF signal to be detected, and the second path being a connection through which the RF signal is transmitted to the amplifier causing the power detector to detect an RF signal of the amplifier.

18 Claims, 8 Drawing Sheets

(51) Int. Cl.
*H04B 1/00* (2006.01)
*H01Q 3/24* (2006.01)
*H01Q 1/22* (2006.01)
*H03F 3/24* (2006.01)

(52) U.S. Cl.
CPC ............ *H03F 3/24* (2013.01); *H04B 1/0458* (2013.01); *H04B 1/0483* (2013.01)

(58) Field of Classification Search
CPC .... H04B 2001/0416; H04B 2001/0433; H04B 2001/045; H01F 3/24; H01F 3/189; H01F 3/19; H01F 3/20; H01F 3/21; H01F 3/213; H01Q 1/2208; H01Q 3/247
See application file for complete search history.

(56) References Cited

U.S. PATENT DOCUMENTS

| | | | |
|---|---|---|---|
| 8,731,494 B2 | 5/2014 | Cohen et al. | |
| 9,705,611 B1 | 7/2017 | West | |
| 9,831,833 B1 * | 11/2017 | Xie | H03F 3/245 |
| 9,960,793 B2 * | 5/2018 | Anthony | H04B 1/0458 |
| 10,652,065 B2 * | 5/2020 | Sarkas | H04B 1/385 |
| 2013/0331042 A1 | 12/2013 | See et al. | |
| 2016/0041221 A1 | 2/2016 | Forstner | |
| 2017/0033454 A1 | 2/2017 | van Bezooijen et al. | |
| 2019/0068180 A1 | 2/2019 | Soga | |
| 2019/0131691 A1 | 5/2019 | Hong et al. | |

\* cited by examiner

ELECTRONIC DEVICE AND METHOD FOR CALIBRATING AND DETECTING PERFORMANCE OF RADIO-FREQUENCY INTEGRATED CIRCUIT

CROSS-REFERENCE TO RELATED APPLICATION(S)

This application is based on and claims priority under 35 U.S.C. § 119 to Korean Patent Application No. 10-2019-0109880, filed on Sep. 5, 2019, in the Korean Intellectual Property Office, the entire disclosure of which is incorporated herein by reference.

BACKGROUND

1. Field

The disclosure relates generally to an electronic device, and more particularly, to a method and an electronic device for detecting performance of a radio communication circuit and for performing calibration.

2. Description of Related Art

A radio communication circuit (e.g., a radio-frequency integrated circuit (RFIC)) changes a voice and data signal from a modem into a frequency that is transmittable to the outside, and uses the frequency for data transmission or reception between an electronic device and a base station. The electronic device contains a radio communication circuit module (e.g., a millimeter wave (mmWave) module) in the form of a plurality of chipsets, in order to support radio communication in a super-high-frequency mmWave band.

In mmWave band radio communication technology, transmission of a radio frequency (RF) signal using accurate power is important for a high transmission rate, and distortion that occurs in a signal while the signal passes through a signal path needs to be minimized. However, load mismatching tends to occur when an RF signal is amplified according to transmission power. Particularly, load mismatching occurring in a power amplifier (PA) may cause distortion of a signal and deterioration in communication performance. Accordingly, a process of testing RFIC performance and performing calibration may be required in order to minimize variation that a power amplifier may have.

A power detector for adjusting the strength of transmission power may be disposed in a PA included in an RFIC. An electronic device may calibrate an RF chain or transmission power based on a signal detected by the power detector.

For example, when an electronic device detects RFIC performance and performs calibration, separate measurement equipment may be used to measure a signal of a power detector disposed in the electronic device. However, the signal measurement by separate measurement equipment may not accurately measure the performance of the power detector since signal distortion occurs in a signal path, and variation in calibration may be present due to measurement uncertainty.

As another example, if a signal of a power detector included in an RFIC of an electronic device is detected by connecting the power detector to a coupler disposed at the end of an antenna, variation in a signal between the power detector and the coupler may be high, and it tends to be difficult to connect the coupler to all power detectors, which is a user inconvenience. Therefore, it is difficult to identify the difference in the performance of the power detector, and the accuracy of calibration may deteriorate.

Accordingly, there is a need in the art for more accurate measurement data associated with the power detector disposed in the RFIC, in order for accurate calibration to be provided.

SUMMARY

The disclosure is provided to address at least the above-mentioned problems and/or disadvantages and to provide at least the advantages described below.

Accordingly, an aspect of the disclosure is to provide an electronic device and a circuit structure for increasing the accuracy of the performance test on a power detector located in an RFIC.

Another aspect of the disclosure is to provide an electronic device and a circuit structure for increasing the accuracy of calibration and enabling an RF signal to be transmitted at desired transmission power and frequency.

Another aspect of the disclosure is to provide a circuit structure through which an RF signal is directly transmitted to a power detector included in an antenna module, such that a reference value may be configured by considering the performance of the power detector based on a measurement value associated with the power detector, thereby maximizing the accuracy of transmission power and minimizing variation in calibration associated with the power detector and a power amplifier, enabling accurate calibration to be performed.

Another aspect of the disclosure is to provide an electronic device that may test the power detector periodically while the electronic device is operating and may identify whether an RF chain or a radio communication circuit operates normally.

In accordance with an aspect of the disclosure, an electronic device includes an antenna module comprising a plurality of radio frequency (RF) chains, and a processor configured to control the antenna module, wherein each of the RF chains comprises an amplifier that amplifies power and a power detector, and wherein the antenna module further comprises a switching circuit that selectively switches between a first path and a second path, the first path being a connection through which an RF signal converted in the antenna module is transmitted to the power detector causing the RF signal to be detected, and the second path being a connection through which the RF signal is transmitted to the amplifier causing the power detector to detect an RF signal of the amplifier.

In accordance with another aspect of the disclosure, an electronic device includes an intermediate frequency integrated circuit (IFIC) configured to process a signal in a designated frequency band, at least one antenna module comprising an RFIC having a plurality of RF chains, and a processor configured to control the IFIC and the antenna module, wherein the RFIC further comprises at least one amplifier configured to amplify power, at least one power detector, and a converter connected to the at least one power detector, a first switch configured to perform switching so as to transfer an RF signal converted in the RFIC to a first output end or to transfer the RF signal to a second output end connected to the at least one amplifier, and a second switch configured to perform switching so as to output the RF signal, transferred from the first output end of the first switch, to the power detector, or to output, by at least one amplifier connected to the second output end of the first switch, an amplified signal of the RF signal to the power detector.

In accordance with another aspect of the disclosure, a detection element performance test and calibration method of an electronic device includes connecting a first path to a detection element by controlling switches so that an RF signal is transferred to the detection element included in RFIC, transferring, to a power detector corresponding to an amplifier, the RF signal converted in the RFIC based on the first path, receiving a measurement value of the RF signal from the power detector, configuring a reference value for the power detector based on the measurement value of the RF signal of the power detector, configuring power levels associated with performance ranges of the power detector based on the configured reference value for the power detector, amplifying the RF signal using the amplifier based on the power levels of the power detector, receiving an output value of the amplifier from the power detector, and performing calibration on transmission power based on the received output value of the amplifier.

BRIEF DESCRIPTION OF THE DRAWINGS

The above and other aspects, features, and advantages of certain embodiments of the disclosure will be more apparent from the following detailed description, taken in conjunction with the accompanying drawings, in which.

DETAILED DESCRIPTION

Figure 1:
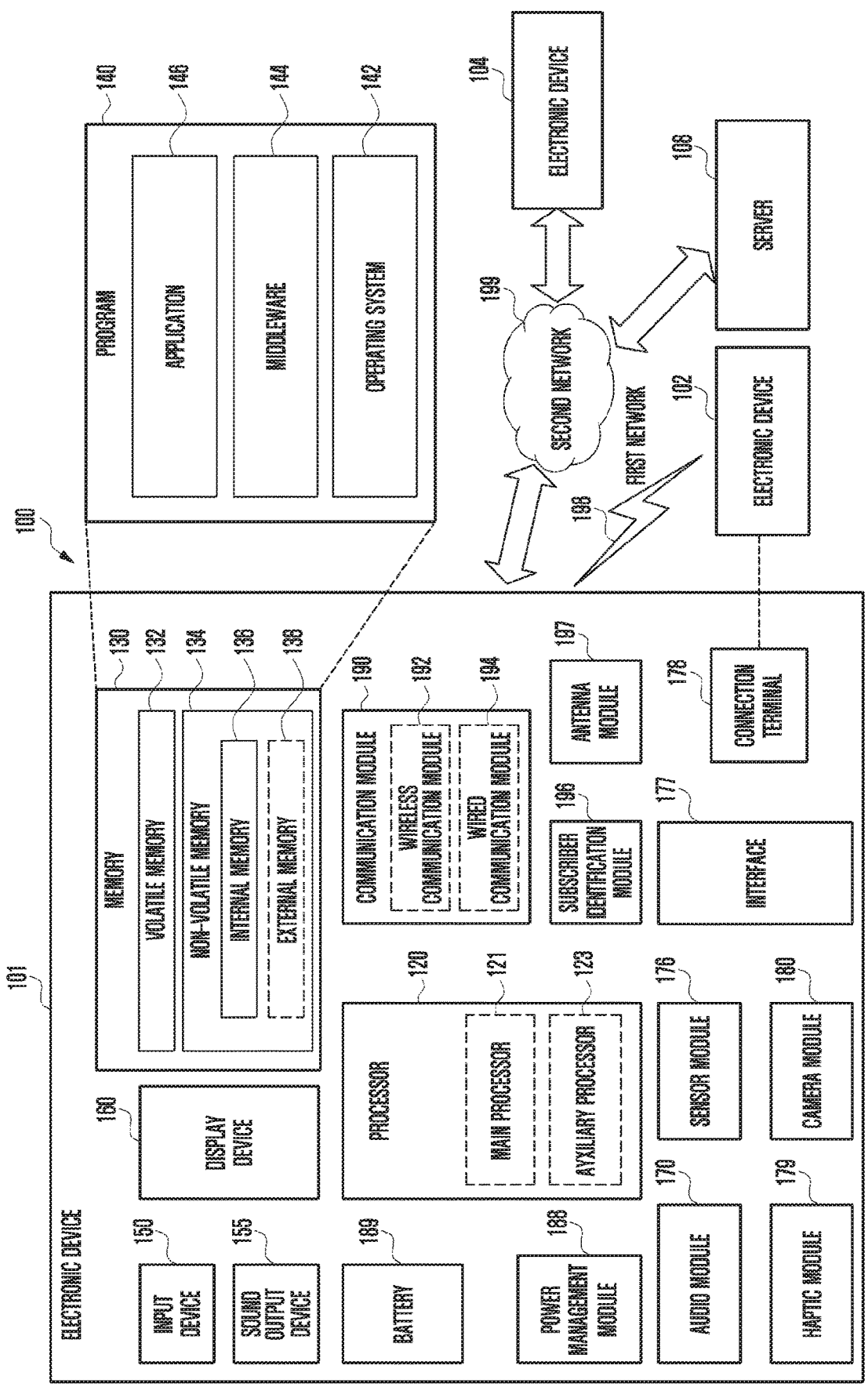
FIG. 1 illustrates an electronic device 101 in a network environment 100 according to an embodiment.

Hereinafter, embodiments will be described in detail with reference to the accompanying drawings. Although specific embodiments are illustrated in the drawings and described in detail with reference thereto, this is not to limit the embodiments to specific forms. Detailed descriptions of known functions and/or configurations will be omitted for the sake of clarity and conciseness.

The electronic device according to various embodiments may be one of various types of electronic devices. The electronic devices may include a portable communication device (e.g., a smart phone), a computer device, a portable multimedia device, a portable medical device, a camera, a wearable device, or a home appliance. of the disclosure, the electronic devices are not limited to those described above.

FIG. 1 illustrates an electronic device 101 in a network environment 100 according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include software (e.g., the program 140) and input data or output data for a command related thereto. The memory 130 may include the volatile memory 132 or the non-volatile memory 134.

The program 140 may be stored in the memory 130 as software, and may include an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include a microphone, a mouse, a keyboard, or a digital pen (e.g., a stylus pen).

The sound output device 155 may output sound signals to the outside of the electronic device 101. The sound output device 155 may include a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of a power management integrated circuit (PMIC).

The battery 189 may supply power to at least one component of the electronic device 101. According to an embodiment, the battery 189 may include a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas.

In such a case, at least one antenna appropriate for a communication scheme used in the communication network, such as the first network 198 or the second network 199, may be selected by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device 101 may include an antenna array including a plurality of antennas. The electronic device may include a phase array or a plurality of RF chains for multi-stream transmission or beamforming. In the case of signal transmission/reception for communication, the electronic device 101 may support beamforming technology. Beamforming performs control so that signals output respectively from a plurality of antennas are transmitted to the same destination.

Figure 2:
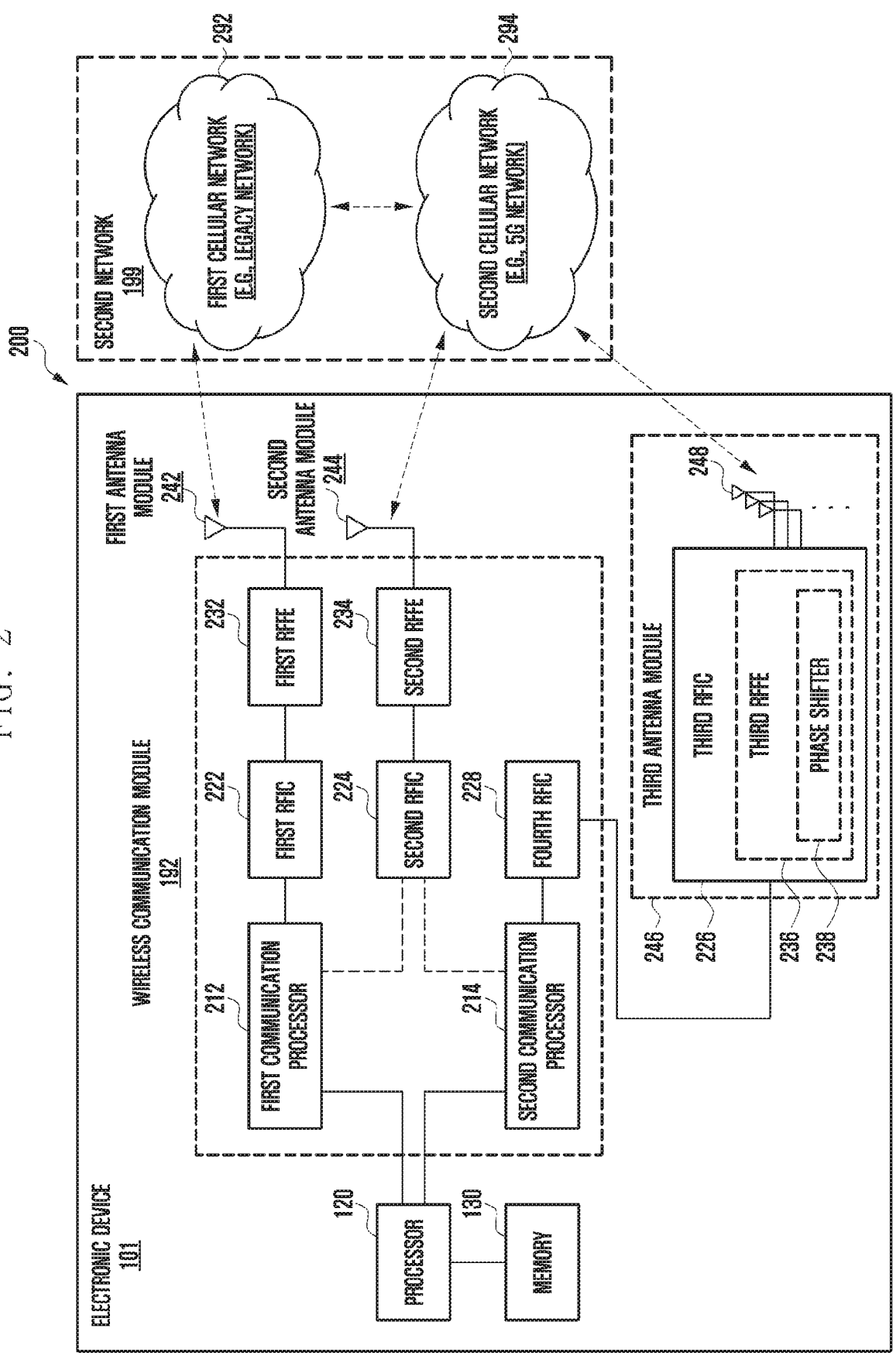
FIG. 2 illustrates the electronic device 101 in a network environment including a plurality of cellular networks according to an embodiment.

FIG. 2 illustrates the electronic device 101 in a network environment including a plurality of cellular networks according to an embodiment.

Referring to FIG. 2, the electronic device 101 includes a first communication processor 212, a second communication processor 214, a first RFIC 222, a second RFIC 224, a third RFIC 226, a fourth RFIC 228, a first radio-frequency front end (RFFE) 232, a second RFFE 234, a first antenna module 242, a second antenna module 244, an antenna 248, the processor 120, and the memory 130. The second network 199 may include a first cellular network 292 and a second cellular network 294. The electronic device 101 may further include at least one component among the components illustrated in FIG. 1, and the second network 199 may further include at least one other network. The first communication processor 212, the second communication processor 214, the first RFIC 222, the second RFIC 224, the fourth RFIC 228, the first RFFE 232, and the second RFFE 234 may be at least a part of the radio communication module 192. The fourth RFIC 228 may be omitted or may be included as a part of the third RFIC 226.

The first communication processor 212 may establish a communication channel of a band to be used for radio communication with the first cellular network 292 and may support legacy network communication via the established communication channel. The first cellular network may be a legacy network including a $2^{nd}$ generation (2G), 3rd generation (3G), $4^{th}$ generation (4G), or long-term evolution (LTE) network. The second communication processor 214 may establish a communication channel corresponding to a designated band (e.g., approximately 6 gigahertz (GHz) to 60 GHz) among bands to be used for radio communication with the second cellular network 294, and may support 5G network communication via the established communication channel. The second cellular network 294 may be a 5G network defined in the third generation partnership project (3GPP). Additionally, the first communication processor 212 or the second communication processor 214 may establish a communication channel corresponding to another designated band (e.g., approximately 6 GHz or less) among bands to be used for radio communication with the second cellular network 294, and may support 5G network communication via the established channel. The first communication processor 212 and the second communication processor 214 may be implemented in a single chip or a single package. The first communication processor 212 or the second communication processor 214 may be implemented in a single chip or a single package together with the processor 120, the sub-processor 123, or the communication module 190. The first communication processor 212 and the second communication processor 214 may be connected directly via an interface or indirectly and may provide or receive data or control signals unidirectionally or bidirectionally.

In the case of transmission, the first RFIC 222 may convert a baseband signal generated by the first communication processor 212 into an RF signal in the range of approximately 700 megahertz (MHz) to 3 GHz, which is used in the first cellular network 292 (e.g., a legacy network). In the case of reception, an RF signal is obtained from the first cellular network 292 via the first antenna module 242, and may be pre-processed via the first RFFE 232. The first RFIC 222 may convert the preprocessed RF signal into a baseband signal that is processed by the first communication processor 212.

In the case of transmission, the second RFIC 224 may convert a baseband signal generated by the first communication processor 212 or the second communication processor 214 into an RF signal (hereinafter, a 5G Sub6 RF signal) in a Sub6 band (e.g., approximately 6 GHz or less) used in the second cellular network 294 (e.g., a 5G network). In the case of reception, a 5G Sub6 RF signal is obtained from the second cellular network 294 via the second antenna module 244, and may be preprocessed by the second RFFE 234. The second RFIC 224 may convert the preprocessed 5G Sub6 RF signal into a baseband signal so that the signal is processed by a corresponding communication processor selected from among the first communication processor 212 and the second communication processor 214.

The third RFIC 226 may convert a baseband signal generated by the second communication processor 214 into an RF signal (hereinafter, a 5G Above6 RF signal) of a 5G Above6 band (e.g., approximately 6 GHz to 60 GHz) to be used in the second cellular network 294 (e.g., a 5G network). In the case of reception, a 5G Above6 RF signal is obtained from the second cellular network 294 via an antenna (e.g., the antenna 248), and may be preprocessed by the third RFFE 236. The third RFIC 226 may convert the preprocessed 5G Above6 RF signal into a baseband signal so that the signal is processed by the second communication processor 214. The third RFFE 236 may be implemented as a part of the third RFIC 226.

The electronic device 101 may include the fourth RFIC 228, separately from or, as at least a part of, the third RFIC 226. In this instance, the fourth RFIC 228 may convert the baseband signal generated by the second communication processor 214 into an intermediate frequency (IF) signal in an IF band (e.g., approximately 9 GHz to 11 GHz), and may transfer the IF signal to the third RFIC 226. The third RFIC 226 may convert the IF signal into a 5G Above6 RF signal. In the case of reception, a 5G Above6 RF signal may be received from the second cellular network 294 via the antenna 248, and may be converted into an IF signal by the third RFIC 226. The fourth RFIC 228 may convert the IF signal into a baseband signal so that the second communication processor 214 may process the signal.

The first RFIC 222 and the second RFIC 224 may be implemented as a single chip or at least a part of a single package. The first RFFE 232 and the second RFFE 234 may be implemented as a single chip or at least a part of a single package. At least one of the first antenna module 242 and the second antenna module 244 may be omitted, or may be combined with another antenna module, so as to process RF signals of a plurality of corresponding bands.

The third RFIC 226 and the antenna 248 may be disposed in the same substrate and may form the third antenna module 246. For example, the radio communication module 192 or the processor 120 may be disposed in a first substrate (e.g., main printed circuit board (PCB)). In this instance, the third RFIC 226 is disposed in a lower part of a second substrate (e.g., a sub PCB) different from the first substrate, and the antenna 248 is disposed in an upper part, so that the third antenna module 246 is formed. By disposing the third RFIC 226 and the antenna 248 in the same substrate, the length of a transmission line therebetween may be reduced, thereby reducing the loss (e.g., attenuation) of a high-frequency band signal (e.g., approximately 6 GHz to 60 GHz) used for 5G network communication, the loss being caused by a transmission line.

Accordingly, the electronic device 101 may improve the quality or speed of communication with the second cellular network 294. The antenna 248 may be implemented as an antenna array including a plurality of antenna elements which may be used for beamforming. In this instance, the third RFIC 226 may be a part of the third RFFE 236 and may include a plurality of phase shifters 238 corresponding to a plurality of antenna elements. In the case of transmission, each of the plurality of phase shifters 238 may shift the phase of a 5G Above6 RF signal to be transmitted to the outside of the electronic device 101 (e.g., a base station of a 5G network) via a corresponding antenna element. In the case of reception, each of the plurality of phase shifters 238 may shift the phase of a 5G Above6 RF signal received from the outside via a corresponding antenna element into the same or substantially the same phase. This enables transmission or reception via beamforming between the electronic device 101 and the outside.

The second cellular network 294 may operate independently (e.g., Standalone (SA)) from the first cellular network 292, or may operate by being connected thereto (e.g., Non-Standalone (NSA)). For example, in the 5G network, only 5G radio access network (RAN) or a next-generation RAN (NG RAN) may be present, and a next-generation core (NGC) may not be present. In this instance, the electronic device 101 may access the access network of the 5G network, and may access an external network (e.g., the Internet) under the control of an evolved packed core (EPC) of the legacy network. LTE protocol information for communication with the legacy network or new radio (NR) protocol information for communication with the 5G network may be stored in the memory 230, and may be accessed by the processor 120, the first communication processor 212, or the second communication processor 214.

Figure 3:
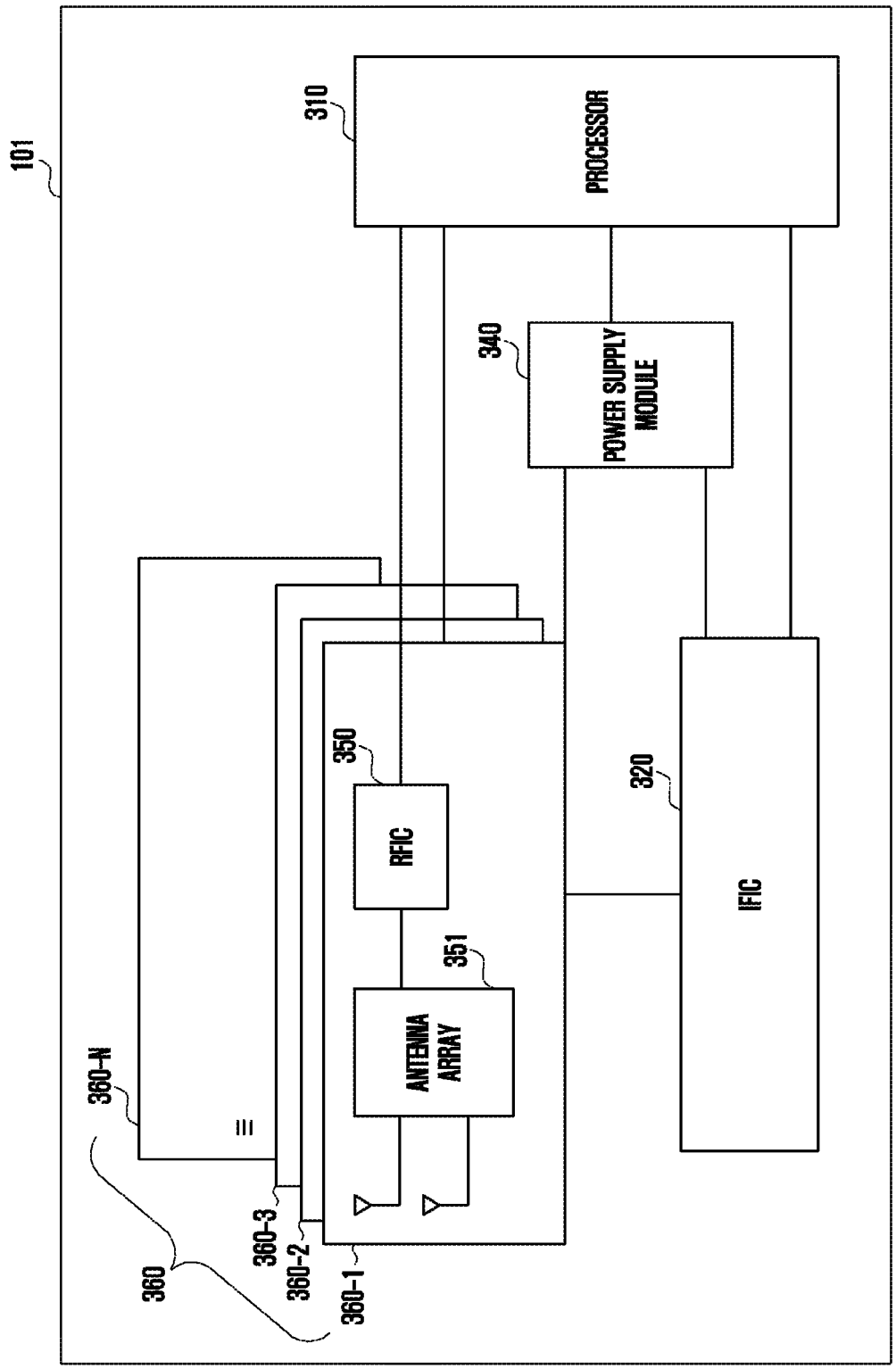
FIG. 3 illustrates the electronic device 101 that supports radio communication in a super-high frequency (mmWave) band according to an embodiment.

FIG. 3 illustrates the electronic device 101 that supports radio communication in a super-high frequency (mmWave) band according to an embodiment.

Referring to FIG. 3, the electronic device 101 includes a processor 310, an IF integrated circuit (IFIC) 320, a power supply module 340, and at least one antenna module (e.g., mmWave module) 360. The electronic device 101 may further include at least one element among the elements illustrated in FIG. 1 or FIG. 2.

The IFIC 320 may be connected to the processor 310 and the at least one antenna module 360. The IFIC 320 may convert a baseband signal transferred from the processor 310 into a signal of an IF signal of approximately 9 GHz to 11 GHz. The IFIC 320 may transfer an IF signal to at least one antenna module 360. The IFIC 320 may convert an IF signal received from the antenna module 360 into a baseband signal, and may transmit the signal to the processor 310, so that the processor 310 can process the signal.

The IFIC 320 may simultaneously convert one or more IF signals into baseband signals or may simultaneously convert one or more baseband signals into IF signals. The IFIC 320 may include one or more reception circuits and/or one or more transmission circuits for supporting multiple frequency bands, multiple radio technologies, carrier aggregation, multiple-input and multiple-output (MIMO), etc.

The power supply module 340 may receive voltage from a power source (e.g., a battery) or an external power source, and may provide power to the processor 310, the IFIC 320, and elements included in the at least one antenna module 360. The power supply module 340 may supply signal transmission power to the antenna module 360 under the control of the processor 310. The power supply module 340 may be implemented as at least some elements of the antenna module 360. The power supply module 340 may be implemented as at least a part of a PMIC.

The at least one antenna module 360 may include an antenna array 351 and an RFIC 350. In FIG. 3, the antenna module 360 is implemented as a plurality of antenna modules 360-1, 360-2, 360-3, . . . , and 360-N, but the disclosure is not limited thereto.

An antenna array 351 may include a plurality of antenna elements disposed to form a directional beam. The antenna array 351 may include at least one antenna that supports at least one of beamforming, massive MIMO technology, full-dimensional MIMO (FD-MIMO), array antenna technology, analog beamforming, or large-scale antenna technology. The size and the shape of each of the antenna elements may be implemented to be different based on a resonant frequency. Each antenna element may include an antenna switch. Depending on ON/OFF control by antenna switches, a signal transmission or reception path may be connected or switched.

The RFIC 350 may be implemented to process a signal transmitted or received via the antenna array 351 or a signal in a selected frequency band. In the case of transmission, the RFIC 350 may up-convert an IF signal (e.g., approximately 9 GHz to 11 GHz) obtained from an IFIC into an RF signal in a selected band. In the case of reception, the RFIC 350 may down-convert an RF signal obtained via the antenna array 351 into an IF signal and may transfer the IF signal to the IFIC 320. For example, the RFIC 350 may support beamforming, in which signals output respectively from a plurality of antennas are transmitted to the same destination when a communication signal is transmitted or received.

The IFIC 320 and/or the RFIC 350 may include at least one diplexer that may selectively change the path along which a signal is transferred. The electronic device 101 may use at least one diplexer to enable signals having different frequency bands to diverge based on a predetermined frequency and may control path conversion of the diverged signal.

The RFIC 350 may include various elements used for configuring a plurality of RF chains. An RF chain may be a transmission RF chain, a reception RF chain, or a transmission and reception chain, and may be understood to be an RF signal path. For example, at least one antenna may be connected to a single RF chain.

A single RF chain may transfer a single signal stream. For example, a transmission RF chain may be understood to be a path including at least one of a digital-to-analog converter (DAC), an in/quadrature phase (I/Q) modulator, an IF amplifier, an IF mixer, an IF filter, an RF mixer, an RF filter, and a PA. A reception RF chain may be understood to be a path including at least one of a low-noise amplifier (LNA), an RF filter, an RF mixer, an IF filter, an IF mixer, an IF LNA, an in/quadrature phase (I/Q) demodulator, and an analog-to-digital converter (ADC).

The RFIC 350 may include at least one switch circuit or a switch circuit set that supports switching between an RF transmission path and a test path that supports testing the performance of a detection element (e.g., a power detector) included in the RFIC 350, and supports calibration.

The processor 310 may establish a communication channel corresponding to a designated band (e.g., approximately 6 GHz to 60 GHz) among bands to be used for radio communication and may support 5G network communication via the established communication channel. The processor 310 may be the processor 120 of FIG. 1 or the second communication processor 214 of FIG. 2. The processor 310 may control other elements connected to the processor 310 and may perform data processing or operations.

The processor 310 may control conversion of the path of a switch circuit included in the antenna module 360 and may control the ON/OFF operation of a switch. The processor 310 may configure a signal path, and may selectively control, based on the signal path, connection lines of switches included in a switch circuit. For example, the processor 310 may selectively control the connection of switches based on a test path or a configured RF transmission path.

The processor 310 may configure an RF reception path or an RF transmission or reception path and may selectively control the connection of switches based on the configured RF reception path or RF transmission or reception path. The processor 310 may perform calibration on an RF transmission path. The processor 310 may configure a switch circuit of the RFIC 350 to connect a test path in order to check the performance of a power detector. For example, the processor 310 may control connection of switches so that an RF signal is transferred to a power detector included in the RFIC when a test path is configured.

The processor 310 may configure a switch circuit of the RFIC 350 to connect an RF transmission path in order to transmit an RF signal to the outside. The processor 310 may control connection of switches so that an RF signal is transferred to a PA, which is connected to a power detector are connected when an RF transmission path is configured.

The processor 310 may identify the output value of an RF signal that is transferred from a power detector of the RFIC 350 based on a test path. The processor 310 may identify an RF output signal of a power detector as a voltage value at an ADC connected to the power detector. The processor 310 may configure a power detector reference for a power detector based on the output value of an RF signal measured at the power detector.

The processor 310 may identify the range of performance of a power detector, which is measured based on a reference value, and may identify the power levels of a power amplifier. The processor 310 may configure the power levels of a PA based on a low range, a middle range, and a high range.

The processor 310 may configure the RFIC 350 to connect an RF transmission path, may amplify an RF signal for each power level of a PA using the PA, and may obtain a PA output value. The processor 310 may obtain a PA output value as a voltage value using a power detector connected to the PA.

The processor 310 may determine a calibration parameter for an RF transmission path based on a reference value for a PA and a PA output value. For example, a PA of the RFIC 350 may be implemented to operate within a range in which a voltage varies between the minimum voltage (Vmin) and the maximum voltage (Vmax) due to the characteristic of an element, and does not exceed the maximum current (Imax). The processor 310 may determine a calibration parameter according to the performance of a PA in order to amplify an RF signal to have a desired RF output voltage, and may perform calibration on an RF transmission path along which an RF signal is transferred to an antenna.

As described above, an electronic device according to an embodiment may include an antenna module 360 including a plurality of RF chains, and a processor 310 configured to control the antenna module, wherein each RF chain may include an amplifier that amplifies power and a power detector, and the antenna module may further include a switching circuit that selectively switches between a first path and a second path, the first path being connected to transfer an RF signal converted in the antenna module to the power detector so that the RF signal is detected, and the second path being connected to transfer the RF signal to the amplifier so that the power detector detects an RF signal of the amplifier.

The antenna module may include an RFIC, and the switch circuit disposed in the RFIC may further include a first switch, configured to perform switching in order to transfer an RF signal of an input end to a first output end connected to an input end of a second switch, or to transfer the RF signal to a second output end connected to the at least one amplifier, and the second switch, configured to perform switching so as to transfer an RF signal transferred from the first output end of the first switch to the power detector, or to transfer an output signal of the amplifier to the power detector.

The processor may be configured to change connection lines of the first switch and the second switch in order to connect the first path when a test path of the power detector is configured, and to connect the second path when an RF transmission path is configured.

The processor may be configured to receive a measurement value of an RF signal from the power detector based on the first path, which transfers the RF signal to the power detector, in order to configure a reference value for the power detector.

The processor may configure power levels associated with performance ranges of the power detector based on the reference value for the power detector, amplify an RF signal using the amplifier based on the configured power levels of the power detector via the second path, detect an RF signal output value of the amplifier from the power detector, and determine a calibration parameter for transmission power based on the reference value for the power detector and the RF signal output value of the amplifier.

The processor may be configured to transmit an RF signal by controlling the power of the amplifier using the calibration parameter.

The electronic device may further include a converter, disposed between the power detector and the processor, wherein the power detector may be configured to detect an input signal and to output the detected signal to the converter, and the converter may be configured to convert the output value of the power detector into a digital value and to transfer the digital value to the processor, and the processor may be configured to change the digital value into a code value in order to measure an output signal of the power detector.

The switching circuit may further include a first switch, configured to perform switching in order to transfer an RF signal of an input end to a first output end connected to an input end of a second switch, or to transfer the RF signal to a second output end connected to the at least one amplifier, the second switch, selectively connected to a power detector of each RF chain in order to transfer an RF signal transferred from a first output end of the first switch to the power detector, and configured to have output lines, the number of which corresponds to the number of power detectors corresponding to the amplifier, and a third switch, configured to perform switching in order to transfer an RF signal transferred from the second switch to a power detector of each RF chain, or to transfer an amplified signal of an RF signal transferred to the second output end of the first switch to the power detector, wherein the third switch is disposed in a power detector of each RF chain.

The electronic device may further include a conversion switch, configured to switch a connection path between the converter and a power detector of an amplifier included in each RF chain.

In the disclosure, respective power detectors included in the plurality of RF chains are connected to a plurality of switch circuits that provide the first path and the second path, and the processor may be configured to switch between the first path and the second path in order to measure a signal from each power detector, to determine a calibration parameter for each power detector, and to perform calibration for all RF chains.

The electronic device may further include a distributor disposed between a second output end of a first switch and at least one amplifier, wherein the distributor is configured to transfer an RF signal to each amplifier.

Figure 4A:
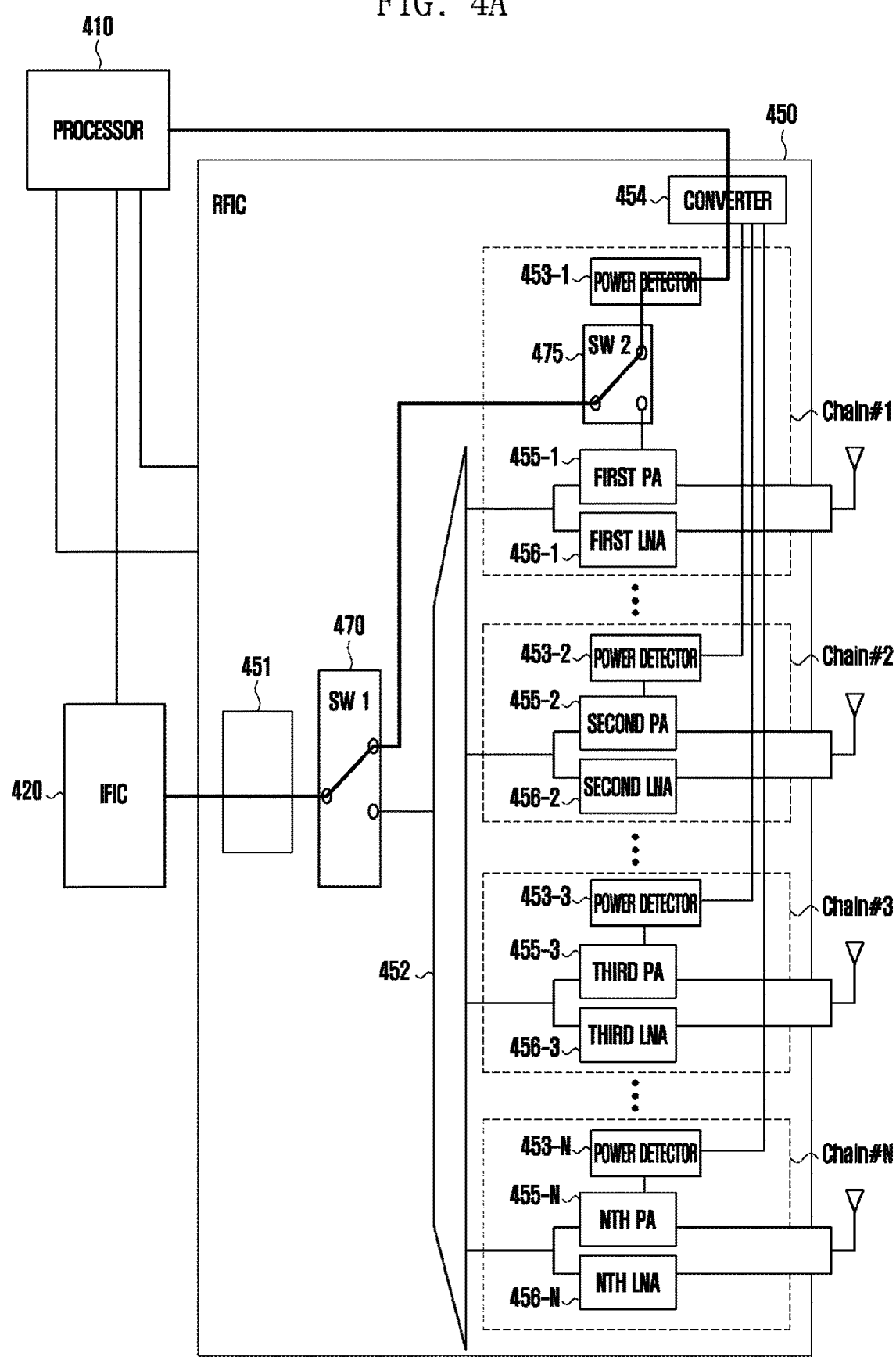
FIG. 4A illustrates a circuit structure of an RFIC of an electronic device according to an embodiment.
Figure 4B:
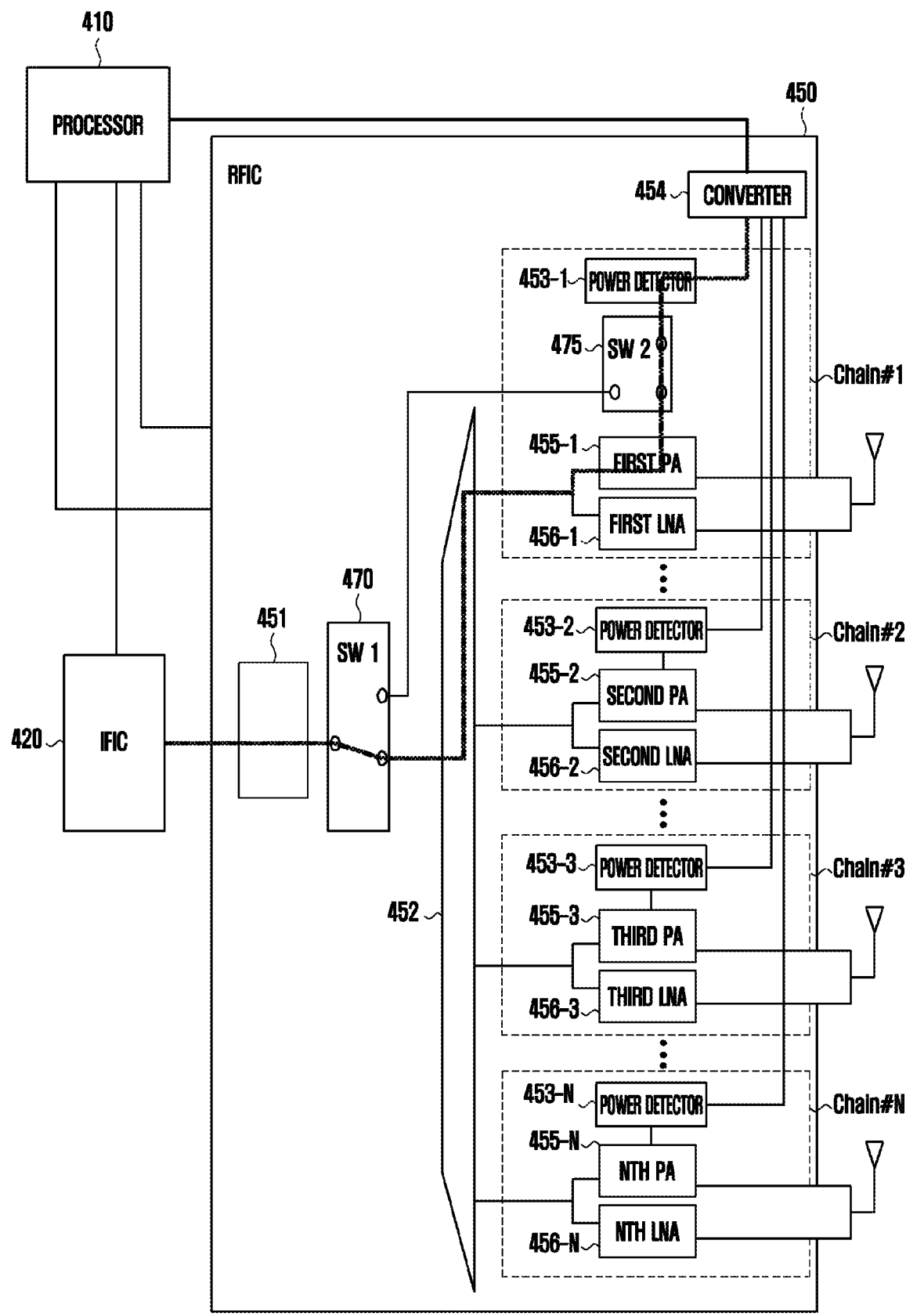
FIG. 4B illustrates a circuit structure of an RFIC of an electronic device according to an embodiment.

FIG. 4A illustrates the circuit structure of an RFIC of an electronic device according to an embodiment, and FIG. 4B illustrates the circuit structure of an RFIC of an electronic device according to an embodiment.

Referring to FIGS. 4A and 4B, an RFIC 450 included in an electronic device may include a first switch (SW 1) 470 and a second switch (SW 2) 475 in order to test the performance of a power detector 453-1 disposed inside the RFIC 450, and to support calibration. The first switch 470 and the second switch 475 may support switching the RFIC 450 between a power detector test path and an RF transmission path.

The electronic device may include a processor 410, an IFIC 420, and the RFIC 450.

The IFIC 420 may convert one or more IF signals into baseband signals and may transfer the baseband signals to the processor 410, or may convert one or more baseband signals into IF signals and transfer the IF signals to the RFIC 450 under the control of the processor 410.

The RFIC 450 may process an RF signal under the control of the processor 410. For example, the RFIC 450 may convert an IF signal obtained from an IFIC into an RF signal in a transmission frequency band. The RFIC 450 may be the RFIC 350 included in the antenna module 360 of FIG. 3. For ease of description, in FIGS. 4A and 4B, a control line for controlling elements included in the RFIC 450 is omitted.

The RFIC 450 may include a mixer 451, a distributor 452, amplifiers 455-1, 456-1, 455-2, 456-2, 455-3, 456-3 . . . 455-N, and 456-N, power detectors 453-1, 453-2, 453-3, . . . , and 453-N, a converter 454, SW 1 470, and SW 2 475.

The RFIC 450 may be implemented as a structure that selectively switches between an RF transmission path and a test path for testing the performance of any one of the power detectors and for performing calibration. For example, under the control of the processor 410, when a test path is configured, the IFIC 420, and the mixer 451 are connected to the power detector 453-1, and an RF transmission path may be blocked in the RFIC 450. Under the control of the processor 410, when an RF transmission path is configured, the IFIC 420 and the mixer 451 are connected to the first PA 455-1, and the power detector 453-1 and the first PA 455-1 are connected, and a test path may be blocked in the RFIC 450.

The RFIC 450 may further include a first RF chain (chain #1), a second RF chain (chain #2), a third RF chain (chain #3), . . . , and an $N^{th}$ RF chain (chain #N)), where N may be a natural number greater than or equal to 2. Although FIGS. 4A and 4B illustrate four chains for ease of description, the disclosure is not limited thereto. An RF chain may include various elements in addition to the elements illustrated in FIGS. 4A and 4B in order to implement a transmission RF chain or a reception RF chain.

The mixer 451 may be connected to the IFIC 420 or the processor 410 that transfers an IF signal or may be connected to the first switch 470. The mixer 451 may convert the central frequency of an input signal and may output a signal having the converted central frequency. For example, the mixer 451 may convert an IF signal into an RF signal or may convert an RF signal into an IF signal. The frequency of an RF signal may be expressed as the sum of the frequency of an IF signal and the frequency of a local oscillator (LO) signal. Conversely, the frequency of an IF signal may be expressed as a value obtained by subtracting the frequency of an LO signal from the frequency of an RF signal. The mixer 451 may convert an IF signal input from the IFIC 420 or the processor 410 into an RF signal and may provide the RF signal to the first switch 470.

The first switch 470 may be connected to the mixer 451 and may be selectively connected to the second switch 475 or the distributor 452. The first switch 470 may be of a single-pole double-throw (SPDT) type. The common terminal of the first switch 470 on the input end may be connected to the mixer 451, and the other terminals A and B on the output end may be connected to the second switch 475 and the distributor 452, respectively. The first switch 470 may provide an RF signal transferred from the mixer 451 to the second switch 475 or the distributor 452. For example, the first switch 470 may be switched so that an RF signal is transferred to the second switch 475 when a test path is configured, and may be switched so that an RF signal is transferred to the distributor 452 when an RF transmission path is configured.

The second switch 475 may be connected to the first switch 470 on the common terminal side and may be selectively connected to the power detector 453-1 at terminal A or the first PA 455-1 at terminal B. The second switch 475 may be of the SPDT type. The common terminal of the second switch 475 may also be terminal A, connected to the power detector 453-1, in which case the second switch 475 may be connected to the first switch 470 and the first PA 455-1, respectively. The second switch 475 may provide a signal transferred from the first switch 470 to the first PA 455-1 or may provide a signal of the first PA 455-1 to the power detector 453-1. Although it is illustrated that the second switch 475 is connected to the first PA 455-1 included in the first RF chain (chain #1), the second switch 475 may be implemented between an amplifier and a power detector of a chain disposed at another position.

The distributor 452 may be connected to the first switch 470 and may include N nodes connected to RF chains. The distributor 452 may divide an RF signal (e.g., a reference signal) transferred from the first switch 470 and may output duplicate signals obtained through the division. The N signals generated by the distributor 452 may be the same signals as the reference signal. The distributor 452 may be implemented as a signal duplication circuit that duplicates the reference signal so as to provide N signals. For example, a first node of the distributor 452 may be connected to a first PA 455-1 and a first LNA 456-1 of chain #1, a second node may be connected to a second PA 455-2 and a second LNA 456-2 of chain #2, a third node may be connected to a third PA 455-3 and a third LNA 456-3 of chain #3, and an $N^{th}$ node may be connected to an $N^{th}$ PA 455-4 and an $N^{th}$ LNA 456-4 of chain #N.

The first PA 455-1, first LNA 456-1, second PA 455-2, second LNA 456-2, third PA 455-3, third LNA 456-3, . . . , Nth PA 455-N, and $N^{th}$ LNA 456-N may amplify a signal using provided power and may be implemented by a set of a PA for amplifying a transmission (TX) signal and an LNA for low-noise amplifying a receive (RX) signal with respect to a single chain.

The PAs 455-1, 455-2, 455-3, and 455-N may amplify the power of a TX signal at an input-end signal (Rfin) transferred via the distributor 452, and may transfer the amplified signal to an antenna. The PAs 455-1, 455-2, 455-3, and 455-N may further include a driver amplifier (DA) for adjusting the gain of a signal input via an input end and may use a multi-mode in order to increase the power efficiency for each output power. For example, the PAs 455-1, 455-2, 455-3, and 455-N may include at least one transistor, and may control the number of transistors to be turned on based on the maximum output power.

The power detectors 453-1, 453-2, 453-3, and 453-N may detect the output power of the corresponding PA 455-1, 455-2, 455-3, and 455-N. The power detector 453-1 may be connected to the first switch 470 and detect power via a test path, and may be connected to the PA 455-1 and detect power of the PA 455-1 via an RF transmission path.

The power detectors 453-1, 453-2, 453-3, and 453-N may detect a signal coupled with a signal that flows through the PAs 455-1, 455-2, 455-3, and 455-N, and may transfer the coupled signal to the converter 454. Each power detector 453-1, 453-2, 453-3, and 453-N may be connected to the converter 454.

The converter 454 may be connected to the power detectors 453-1, 453-2, 453-3, and 453-N and the processor 410.

The converter 454 may convert an output signal transferred from the power detectors 453-1, 453-2, 453-3, and 453-N, and may transfer the output signal (e.g., a digital value) to the processor 410. The processor 410 may change the output signal transferred from the converter 424 into a code value, and may identify the output power of the power detectors 453-1, 453-2, 453-3, and 453-N. For example, the converter 454 may be an ADC, but the disclosure is not limited thereto. A switch that selectively controls a connection line may be further included between the converter 454 and the detectors 453-1, 453-2, 453-3, and 453-N.

The processor 410 may control path conversion associated with RF transmission or reception paths. For ease of description, a control line for controlling elements included in the RFIC 450 is omitted.

The processor 410 may configure the RFIC 450 to connect a test path for testing the performance of the power detectors 453-1, 453-2, 453-3, and 453-N and for performing calibration, or to connect an RF transmission path. The processor 410 may transfer a control signal associated with signal path conversion to the RFIC 450. For example, FIG. 4A illustrates a connection line associated with a test path, and FIG. 4B illustrates a connection line associated with an RF transmission path.

The processor 410 may configure the RFIC 450 to connect a test path, as illustrated in FIG. 4A. The processor 410 may change connection lines of the first switch 470 and the second switch 475 so that an RF signal output from the mixer 451 is transferred to the power detector 453-1.

When a test path is configured, the first switch 470 may be disconnected from the distributor 452, and the second switch 475 may be disconnected from the PA 455-1. The processor 410 may configure the RFIC 450 to connect a test path, may test the performance of the power detector 453-1 included inside the RFIC 450, and may configure a reference value for the power detectors 453-1, 453-2, 453-3, and 453-N. The processor 410 may identify power levels associated with the performance ranges of the power detectors 453-1, 453-2, 453-3, and 453-N based on the configured reference value for the power detector 453-1.

The processor 410 may configure the RFIC 450 to connect an RF transmission path, as illustrated in FIG. 4B. The processor 410 may change the connection lines of the first switch 470 and the second switch 475 so that an RF signal output from the mixer 451 is transferred to the first PA 455-1 via the distributor 452, and the first PA 455-1) and a power detector 453-1 are connected. The processor 410 may identify the output power of the PA 455 for calibration when the RF transmission path is configured. For example, the processor 410 may amplify an RF signal using a PA based on the power levels of a power detector so as to obtain a PA output value. The processor 410 may compare the output value of the first PA 455-1 and a reference value for an RF signal directly input to the power detector 453-1, and may identify a calibration parameter for the RF transmission path. The processor 410 may perform calibration on the RF transmission path based on the calibration parameter.

The processor 410 may configure the RFIC 450 to connect the RF transmission path and may transmit an RF signal to the outside via any one RF transmission chain and antenna.

Figure 5:
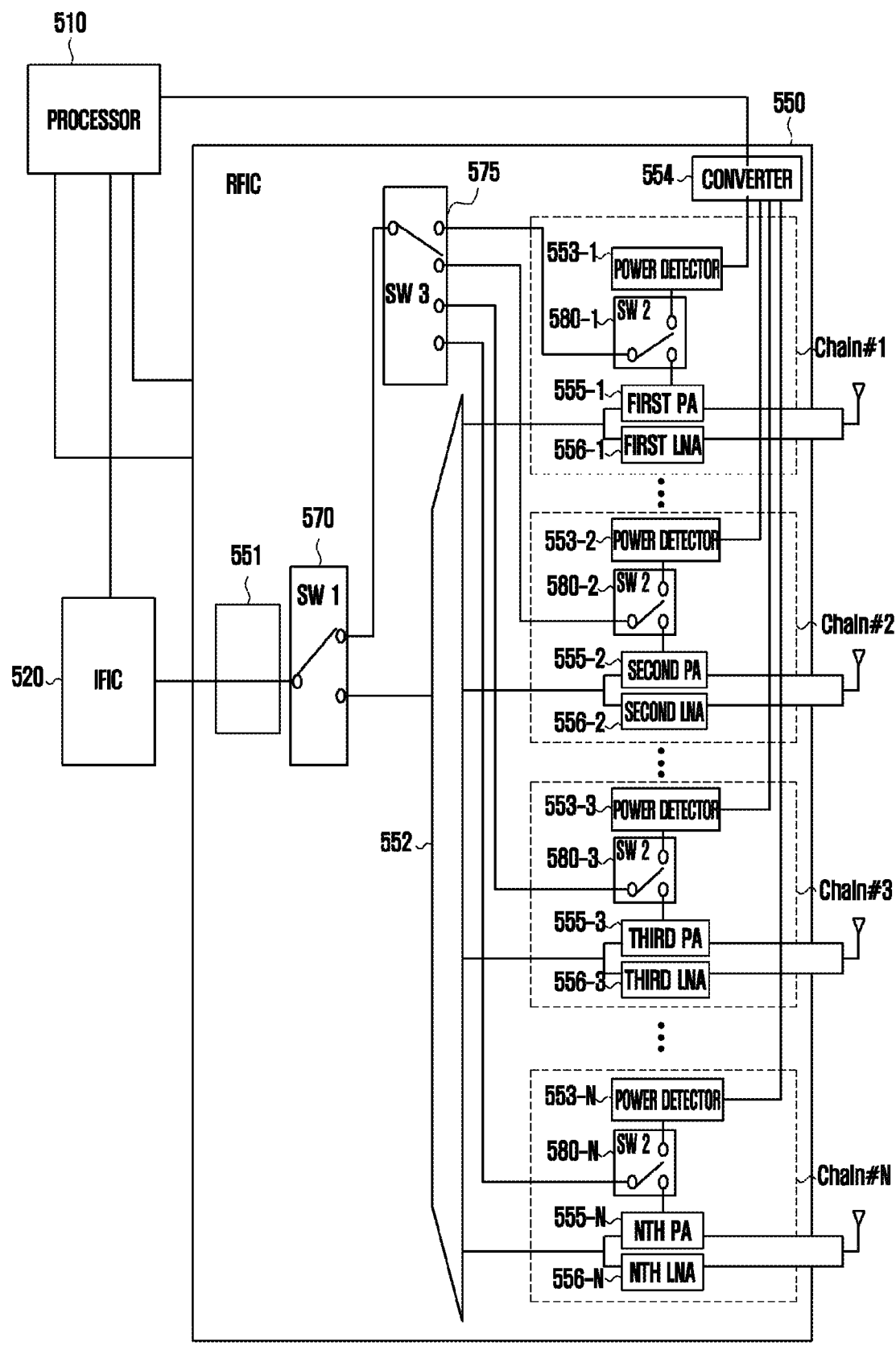
FIG. 5 illustrates a circuit structure of an RFIC of an electronic device according to an embodiment.

FIG. 5 illustrates a circuit structure of an RFIC of an electronic device according to an embodiment.

Referring to FIG. 5, an RFIC 550 included in an electronic device may include a set of a first switch (SW 1) 570, a second switch (SW 2) 575, and third switches (SW 3) 580-1, 580-2, 580-3, and 580-N, in order to test the performance of each power detector disposed inside the RFIC 550, and to support calibration. The RFIC 550 of FIG. 5 may include a mixer 551, a distributor 552, amplifiers 555-1, 556-1, 555-2, 556-2, 555-3, 556-3, . . . , 555-N, and 556-N, power detectors 553-1, 553-2, 553-3, . . . , and 533-N, and a converter 554. Since the elements perform the same operations and functions as those of the elements of FIG. 4, a detailed description thereof will be omitted.

The first switch 570, which provides an RF signal converted in the mixer 551 to terminal B with the distributor 552 or to terminal A with the second switch 575, the second switch 575, which provides a connection line between the first switch 570 and each power detector 553-1, 553-2, 553-3 . . . , and 533-N, and the third switches 580-1, 580-2, 580-3, and 580-N, which provide connection lines between respective power detectors 553-1, 553-2, 553-3, . . . , and 533-N and respective PAs 553-1, 553-2, 553-3, . . . , and 533-N or connection lines between the second switch 575 and power detectors 553-1, 553-2, 553-3, . . . , and 533-N, may be disposed in the RFIC 550.

The first switch 570 may be connected to the mixer 551 by the common terminal and may be selectively connected to the input end of the second switch 575 from terminal A or the input end of the distributor 552 from terminal B.

The input end of the second switch 575 may be connected to any one of the output ends (e.g., the first output end) of the first switch 570, and each output end may be selectively connected to a corresponding third switch 580-1, 580-2, 580-3, and 580-N. Although the second switch 575 is illustrated as being of a single-pole four-throw (SP4T) type in FIG. 5, the second switch 575 may be implemented as being of a different type depending on the number of power detectors 553-1, 553-2, 553-3 . . . , and 533-N. For example, if 8 power detectors are present, the second switch 575 may be implemented as being of a single-pole eight-throw (SP8T) type.

The third switches 580-1, 580-2, 580-3, and 580-N may be implemented to be connected to the second switch 575, or to be selectively connected to the corresponding PAs 555-1, 555-2, 555-3, and 555-N.

The processor 510 may configure the RFIC 550 to connect a test path so as to test the performance of each power detector 553-1, 553-2, 553-3 . . . , and 533-N and to perform calibration for each RF chain.

When a test path is configured, the processor 510 may control conversion of paths of the first switch 570, the second switch 575, and the third switches 580-1, 580-2, 580-3, and 580-N so that an RF signal output from the mixer 551 is transferred via the power detectors 553-1, 553-2, 553-3 . . . , and 533-N.

For example, when a test path associated with the first power detector 553-1 corresponding to the first PA 555-1 is configured, the processor 510 may connect the first switch 570 and the second switch 575, and may control the third switch 580-1 corresponding to the first PA 555-1 so as to connect terminal A of the second switch 575 to the first power detector 553-1, enabling an RF signal to be transferred to the first power detector 553-1.

As another example, when a test path associated with the second power detector 553-2 corresponding to the second PA 555-2 is configured, the processor 510 may connect the first switch 570 and the second switch 575, and may control the third switch 580-2 corresponding to the second PA 555-2 so as to connect terminal B of the second switch 575 to the second power detector 553-2, enabling an RF signal to be transferred to the second power detector 553-2.

As another example, when a test path associated with the third power detector 553-3 corresponding to the third PA 555-3 is configured, the processor 510 may connect the first switch 570 and the second switch 575, and may control the third switch 580-3 corresponding to the third PA 555-3 so as to connect terminal C of the second switch 575 to the third power detector 553-3, enabling an RF signal to be transferred to the third power detector 553-3.

As another example, when a test path associated with the fourth power detector 553-N corresponding to the fourth PA 555-N is configured, the processor 510 may connect the first switch 570 and the second switch 575, and may control the third switch 580-N corresponding to the $N^{th}$ PA 555-4 so as to connect terminal D of the second switch 575 to the fourth power detector 553-N, so that an RF signal is transferred to the fourth power detector 553-N.

An additional switch may be further included between the converter 554 and each power detector 553-1, 553-2, 553-3 . . . , and 533-N, in order to selectively switch a connection therebetween.

When a test path is configured, the processor 510 may receive an RF output value from each power detector 553-1, 553-2, 553-3 . . . , and 533-N, and may configure a reference value. The processor 510 may identify a digital value transferred via the converter 554 as a code value, and may configure a reference value for the power detectors 553-1, 553-2, 553-3 . . . , and 533-N. The processor 510 may configure a reference value based on average data of a measurement value of the first power detector 553-1, a measurement value of the second power detector 553-2, a measurement value of the third power detector 553-3, and a measurement value of the fourth power detector 553-N.

Based on a measurement value of the first power detector 553-1, a measurement value of the second power detector 553-2, a measurement value of the third power detector 553-3, and a measurement value of the fourth power detector 553-N, the processor 510 may configure a reference value for each power detector.

The processor 510 may identify power levels corresponding to the performance ranges of the power detectors 553-1, 553-2, 553-3 . . . , and 533-N based on a configured reference value. The processor 510 may control the conversion of paths of the first switch 470, the second switch 475, and the third switches 580-1, 580-2, 580-3, and 580-N so that an RF signal output from the mixer 551 is transferred to each amplifier via the distributor 552, and so that each PA 555-1, 555-2, 555-3, and 555-N and a corresponding power detector 553-1, 553-2, 553-3 . . . , and 533-N are connected.

The processor 510 may perform control so that each PA 555-1, 555-2, 555-3, and 555-N amplifies an RF signal based on the power levels (e.g., low range, middle range, and high range) of the power detector 553-1, 553-2, 553-3 . . . , and 533-N. The processor 510 may amplify an RF signal using the PA 555-1, 555-2, 555-3, and 555-N, and may obtain the output value of each PA. The processor 510 may compare a reference value and the output value of each PA 555-1, 555-2, 555-3, and 555-N so as to determine a calibration parameter for an RF transmission path, and may perform calibration on the RF transmission path based on the calibration parameter.

Figure 6:
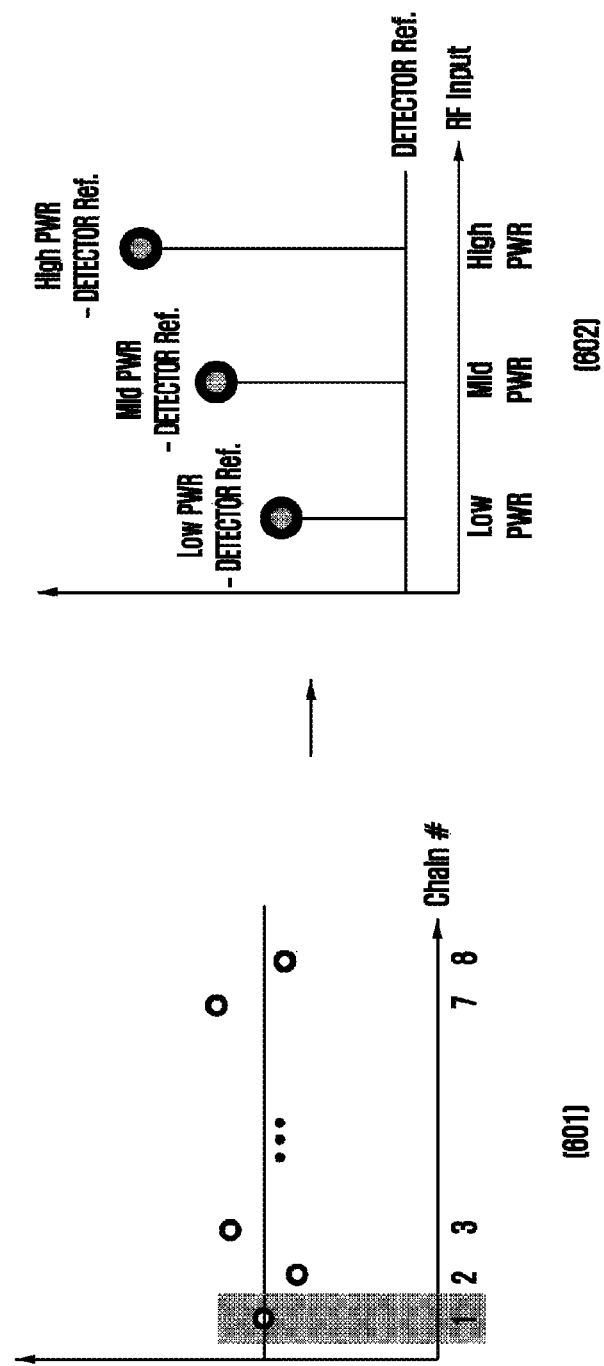
FIG. 6 illustrates measurement data of a power detector of an electronic device according to an embodiment.

FIG. 6 is a diagram illustrating measurement data of a power detector of an electronic device according to an embodiment.

Referring to FIG. 6, the electronic device 101 may test the performance of a power detector contained in an RFIC, and may obtain the output value of a PA for calibration. For example, if eight RF chains are disposed in the RFIC, the electronic device 101 may control connection lines of switches included in the RFIC so as to receive a measurement value of an RF signal from a power detector corresponding to a PA included in each of the eight RF chains, as shown in graph 601. The processor of the electronic device may convert the measurement value of the PA into a code value, and may recognize a voltage value based on the code value, as illustrated in graph 601. The electronic device 101 may configure a reference value based on the measurement value of the power detector and may perform calibration on an RF path.

The electronic device 101 may configure a reference value for each power detector and may perform calibration on all RF chains. For example, the electronic device 101 may configure a reference value based on the measurement value of a first power detector corresponding to a first PA, as illustrated in graph 602, and may identify power levels associated with the performance of the first power detector based on the reference value. The electronic device 101 may classify the power level as a low range (low PWR), a middle range (mid PWR), or a high range (high PWR) based on the reference value (DETECTOR Ref), and may identify the estimated value of a PA output corresponding to each level. The data in graph 602 may be the estimated value of the first PA in association with the performance of the first power detector, based on the reference value.

The electronic device 101 may amplify an RF signal based on the first PA and may obtain the output value of the PA via the power detector. The electronic device 101 may identify a calibration parameter by considering the output value of the PA and the reference value. For example, the electronic device 101 may calculate the difference between the output value of the PA and an estimated value based on the reference value and may determine a calibration parameter for an RF path for transmission at accurate transmission power. Graph 602 merely illustrates the estimated value of the first PA, and a performance test may be performed with respect to a PA included in a second chain, a third chain, . . . , or an $N^{th}$ chain, and a calibration parameter required in order for amplification to have desired transmission power may be determined.

As described above, an electronic device according to an embodiment may include an IFIC configured to process a signal in a designated frequency band, at least one antenna module including an RFIC including a plurality of RF chains, and a processor configured to control the IFIC and the antenna module. The RFIC may further include at least one amplifier for amplifying power, at least one power detector, and a converter connected to the at least one power detector, a first switch configured to perform switching so as to transfer an RF signal converted in the RFIC to a first output end or to transfer the RF signal to a second output end connected to the at least one amplifier, and a second switch configured to perform switching so as to output an RF signal transferred from the first output end of the first switch, to the power detector, or to output, by at least one amplifier connected to the second output end of the first switch, an amplified signal of an RF signal to the power detector.

The processor may be configured to perform control so that an RF signal output from the first output end of the first switch is transferred to the power detector via a first path of the second switch when the power detector is tested, and may be configured to amplify an RF signal output from the second output end of the first switch based on the at least one amplifier and transfer the amplified signal to the power detector via a second path which connects the at least one amplifier and the power detector, when the RF signal is transmitted.

The power detector may be configured to detect an RF signal transferred via the first path, and to transfer the detected RF signal to the converter, or may be configured to detect an amplified signal amplified in the second path, and to transfer the detected signal to the converter, and the converter may be configured to convert an output value transferred from the power detector into a digital value, and to transfer the digital value to the processor.

The processor may be configured to receive an output value of an RF signal from the converter connected to the power detector, based on an RF signal input via the first path, and to configure a reference value of the power detector based on the received output value.

The processor may be configured to configure power levels of the power detector based on a low level range, a mid-level range, and a high level range, based on the reference value of the power detector, amplify, in the second path, an RF signal based on the configured power levels of the power detector and receive an output value of the amplifier from the power detector, and determine a calibration parameter associated with transmission power based on the output value of the amplifier.

The processor may be configured to transmit an RF signal by controlling power of an amplifier using the calibration parameter.

Figure 7:
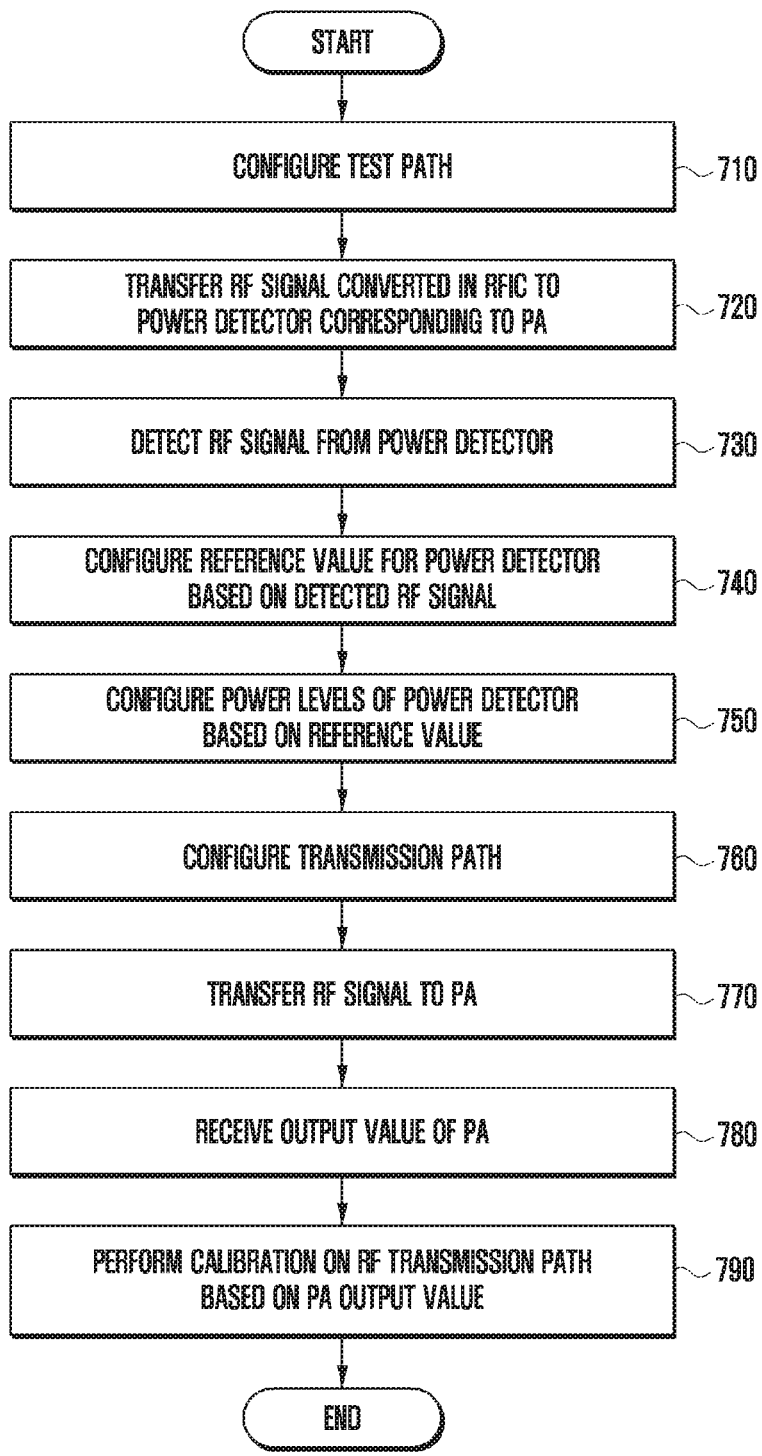
FIG. 7 illustrates a method of testing performance of a detection element of an electronic device and a calibration method according to an embodiment.

FIG. 7 illustrates a method of testing the performance of a detection element of an electronic device and a calibration method according to an embodiment.

Referring to FIG. 7, a processor of the electronic device 101 may control switches of an RFIC so as to connect a test path, in order to test the performance of a detection element, in step 710. Performance test and calibration performed by an electronic device may be performed upon initial release of the electronic device, periodically, or when needed while the electronic device operates.

In step 720, the processor may control the RFIC so that an RF signal converted from an IF signal is transferred to a power detector corresponding to a PA via the test path.

In step 730, the processor may detect a measurement value of the RF signal transferred from the power detector. The power detector may detect the RF signal at an input end and may transfer the RF signal to a converter. The converter may convert the RF signal transferred from the power detector into a digital value (e.g., a voltage value), and may transmit the digital value to the processor. The processor may change the digital value transferred from the converter into a code value and may identify a measurement value of the RF signal directly provided to the power detector included in the RFIC.

In step 740, the processor may configure a reference value for the power detector based on the measurement value of the power detector.

In step 750, the processor may configure power levels of the power detector based on the reference value. For example, the processor may configure the power levels of the power detector based on a low range, a mid-range, and a high range, based on the reference value, and may identify the estimated value of a PA output based on the power levels of the power detector. In step 760, the processor may control the switches of the RFIC so as to connect an RF transmission path in order to transfer an RF signal to the PA.

In step 770, the processor may transfer the RF signal to the PA so as to amplify the signal to have a voltage corresponding to the configured power levels.

In step 780, the processor may receive the output value of the PA via a power detector path.

In step 790, the processor may perform calibration on the RF path based on the output value of the PA. For example, the processor may determine a calibration parameter for transmission power based on the PA output value and the reference value (or an estimated value) for the power detector and may perform calibration based on the calibration parameter.

The performance test on the power detector and calibration may be performed for each power detector corresponding to a PA contained in the RFIC. The term "module" used in the document may include a unit implemented as hardware, software, or firmware, and may be interchangeably used with terms such as "logic", "logic block", "component", "circuit", and the like. A module may be an integrated component or the minimum unit or part of the component that performs one or more functions and may be implemented in the form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been particularly shown and described with reference to certain embodiments thereof, it will be understood by those skilled in the art that various changes in form and details may be made therein without departing from the scope of the subject matter as defined by the appended claims and their equivalents.

What is claimed is:

1. An electronic device, comprising:
an antenna module comprising a plurality of radio frequency (RF) chains; and
a processor configured to control the antenna module,
wherein each of the RF chains comprises an amplifier that amplifies power and a power detector, and
wherein the antenna module further comprises a switching circuit that selectively switches between a first path and a second path, the first path being a connection through which an RF signal converted in the antenna module is transmitted to the power detector causing the RF signal to be detected, and the second path being a connection through which the RF signal is transmitted to the amplifier causing the power detector to detect an RF signal of the amplifier.

2. The electronic device of claim 1, wherein the antenna module comprises a radio-frequency integrated circuit (RFIC), and
wherein the switch circuit disposed in the RFIC further comprises:
a first switch, configured to perform switching so as to transfer the RF signal of an input end to a first output end connected to an input end of a second switch, or to transfer the RF signal to a second output end connected to at least one amplifier; and
the second switch, configured to perform switching so as to transfer an RF signal transferred from the first output end of the first switch to the power detector, or to transfer an output signal of the amplifier to the power detector.

3. The electronic device of claim 2, wherein the processor is further configured to change connection lines of the first switch and the second switch in order to connect the first path when a test path of the power detector is configured, and to connect the second path when an RF transmission path is configured.

4. The electronic device of claim 1, wherein the processor is further configured to receive a measurement value of the RF signal from the power detector, based on the first path that transfers the RF signal to the power detector, so as to configure a reference value for the power detector.

5. The electronic device of claim 4, wherein the processor is further configured to:
configure power levels associated with performance ranges of the power detector, based on the reference value for the power detector;
amplify, in the second path, the RF signal using the amplifier based on the configured power levels of the power detector;
detect an RF signal output value of the amplifier from the power detector; and determine a calibration parameter for transmission power based on the reference value for the power detector and the RF signal output value of the amplifier.

6. The electronic device of claim 5, wherein the processor is further configured to transmit the RF signal by controlling power of the amplifier using the calibration parameter.

7. The electronic device of claim 1, further comprising:
a converter disposed between the power detector and the processor,
wherein the power detector is configured to detect an input signal and to output the detected input signal to the converter, and the converter is configured to convert an output value of the power detector into a digital value and to transfer the digital value to the processor, and
wherein the processor is further configured to change the digital value into a code value, so as to measure an output signal of the power detector.

8. The electronic device of claim 1, wherein the switching circuit further comprises:
a first switch, configured to perform switching so as to transfer an RF signal of an input end of the first switch to a first output end of the first switch connected to an input end of a second switch, or to transfer the RF signal to a second output end of the first switch connected to at least one amplifier;
the second switch, selectively connected to a power detector of each RF chain so as to transfer an RF signal transferred from the first output end of the first switch to the power detector, and configured to have output lines, a number of which being identical to a number of power detectors corresponding to the amplifier; and
a third switch, configured to perform switching so as to transfer an RF signal transferred from the second switch to a power detector of each RF chain, or to transfer an amplified signal of an RF signal transferred to the second output end of the first switch to the power detector,
wherein the third switch is disposed in a power detector of each RF chain.

9. The electronic device of claim 8, further comprising:
a conversion switch configured to switch a connection path between the converter and a power detector corresponding to an amplifier included in each RF chain.

10. The electronic device of claim 8,
wherein respective power detectors included in the plurality of RF chains are connected to a plurality of switch circuits that provide the first path and the second path, and
wherein the processor is further configured to switch between the first path and the second path so as to measure a signal from each power detector, to determine a calibration parameter for each power detector, and to perform calibration for all RF chains.

11. The electronic device of claim 1, further comprising:
a distributor disposed between a second output end of a first switch and at least one amplifier,
wherein the distributor is configured to transfer the RF signal to each amplifier.

12. An electronic device comprising:
an intermediate frequency integrated circuit (IFIC) configured to process a signal in a designated frequency band;
at least one antenna module comprising a radio-frequency integrated circuit (RFIC) having a plurality of RF chains; and a processor configured to control the IFIC and the antenna module,
wherein the RFIC further comprises:
at least one amplifier configured to amplify power, at least one power detector, and a converter connected to the at least one power detector;
a first switch configured to perform switching so as to transfer an RF signal converted in the RFIC to a first output end or to transfer the RF signal to a second output end connected to the at least one amplifier; and
a second switch configured to perform switching so as to output the RF signal, transferred from the first output end of the first switch, to the power detector, or to output, by at least one amplifier connected to the second output end of the first switch, an amplified signal of the RF signal to the power detector.

13. The electronic device of claim 12, wherein the processor is further configured to:
perform control so that the RF signal output from the first output end of the first switch is transferred to the power detector via a first path of the second switch, when the power detector is tested; and
amplify the RF signal output from the second output end of the first switch based on the at least one amplifier, and transfer the amplified signal to the power detector via a second path which connects the at least one amplifier and the power detector, when the RF signal is transmitted.

14. The electronic device of claim 13,
wherein the power detector is configured to detect an RF signal transferred via the first path, and to transfer the detected RF signal to the converter, or is configured to detect an amplified signal amplified in the second path, and to transfer the detected signal to the converter, and
wherein the converter is configured to convert an output value transferred from the power detector into a digital value, and to transfer the digital value to the processor.

15. The electronic device of claim 12,
wherein the processor is further configured to receive an output value of the RF signal from the converter connected to the power detector, based on the RF signal input via the first path, and to configure a reference value for the power detector based on the received output value.

16. The electronic device of claim 12, wherein the processor is further configured to:
configure power levels of the power detector based on a first level range, a second level range, and a third level range, based on the reference value of the power detector;
amplify, in the second path, the RF signal based on the configured power levels of the power detector;
receive an output value of the amplifier from the power detector; and
determine a calibration parameter associated with transmission power, based on the output value of the amplifier.

17. The electronic device of claim 16,
wherein the processor is further configured to transmit the RF signal by controlling power of an amplifier using the calibration parameter.

18. A detection element performance test and calibration method of an electronic device, the method comprising:
connecting a first path to a detection element by controlling switches so that a radio frequency (RF) signal is transferred to the detection element included in a radio-frequency integrated circuit (RFIC);

transferring, to a power detector corresponding to an amplifier, the RF signal converted in the RFIC based on the first path;

receiving a measurement value of the RF signal from the power detector;

configuring a reference value for the power detector based on the measurement value of the RF signal of the power detector;

configuring power levels associated with performance ranges of the power detector based on the configured reference value for the power detector;

amplifying the RF signal using the amplifier based on the power levels of the power detector;

receiving an output value of the amplifier from the power detector; and performing calibration on transmission power based on the received output value of the amplifier.

\* \* \* \* \*